(12) United States Patent
Katsuta et al.

(10) Patent No.: US 9,659,689 B2
(45) Date of Patent: May 23, 2017

(54) MONOLITHIC CERAMIC ELECTRONIC COMPONENT

(71) Applicant: Murata Manufacturing Co., Ltd., Nagaokakyo-shi, Kyoto-fu (JP)

(72) Inventors: Seiji Katsuta, Nagaokakyo (JP); Yasuaki Kainuma, Nagaokakyo (JP); Tatsuya Nagaoka, Nagaokakyo (JP); Akihiro Motoki, Nagaokakyo (JP); Satoshi Kodama, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 528 days.

(21) Appl. No.: 14/311,381

(22) Filed: Jun. 23, 2014

(65) Prior Publication Data

US 2015/0001998 A1 Jan. 1, 2015

(30) Foreign Application Priority Data

Jun. 27, 2013 (JP) ................................. 2013-135327
Apr. 10, 2014 (JP) ................................. 2014-080973

(51) Int. Cl.
*H01L 41/047* (2006.01)
*H01L 41/083* (2006.01)
(Continued)

(52) U.S. Cl.
CPC ........... *H01C 7/008* (2013.01); *H01F 27/292* (2013.01); *H01G 4/12* (2013.01); *H01G 4/232* (2013.01);
(Continued)

(58) Field of Classification Search
CPC ..... H01L 41/047; H01L 41/083; H01L 28/60; H03H 9/131; H01G 9/12; H01G 9/16;
(Continued)

(56) References Cited

U.S. PATENT DOCUMENTS

2006/0105251 A1* 5/2006 Hwang ............... G02B 5/285
  430/7
2006/0187613 A1* 8/2006 Yoshii ............... H01G 4/2325
  361/321.2
(Continued)

FOREIGN PATENT DOCUMENTS

CN  1604244 A  4/2005
EP  1 519 642 A1  3/2005
(Continued)

OTHER PUBLICATIONS

Official Communication issued in corresponding Japanese Patent Application No. 2014-080973, mailed on Jun. 28, 2016.

*Primary Examiner* — Thomas Dougherty
(74) *Attorney, Agent, or Firm* — Keating & Bennett, LLP

(57) ABSTRACT

A monolithic ceramic electronic component includes a ceramic body including a stack of ceramic layers. Inner electrodes are disposed within the ceramic body and include exposed portions at the end surfaces of the ceramic body. A pair of outer electrodes is arranged on the end surfaces of the ceramic body so as to extend from the end surfaces to the main surfaces and side surfaces of the ceramic body. Each of the outer electrodes includes a lower electrode layer provided on the ceramic body, an intermediate electrode layer located on the lower electrode layer and defined by a plated Ni layer, and an upper electrode layer located on the intermediate electrode layer and defined by a plated Pd layer. A thickness of the intermediate electrode layer on the main surfaces and the side surfaces of the ceramic body is larger than a thickness of the intermediate electrode layer on the end surfaces of the ceramic body.

9 Claims, 6 Drawing Sheets

(51) Int. Cl.
  *H01G 4/06* (2006.01)
  *H01G 4/12* (2006.01)
  *H01C 7/00* (2006.01)
  *H01G 4/30* (2006.01)
  *H01L 41/053* (2006.01)
  *H01G 4/232* (2006.01)
  *H01F 27/29* (2006.01)

(52) U.S. Cl.
  CPC ........... H01G 4/30 (2013.01); H01L 41/0471 (2013.01); H01L 41/0475 (2013.01); H01L 41/053 (2013.01)

(58) Field of Classification Search
  CPC ........ H01G 4/2325; H01G 4/30; H01G 4/008; H01G 4/1272
  USPC ....................................................... 310/366
  See application file for complete search history.

(56) References Cited

U.S. PATENT DOCUMENTS

| | | | | |
|---|---|---|---|---|
| 2008/0238264 A1* | 10/2008 | Nakamura | ............ | H01L 41/083 310/364 |
| 2009/0002920 A1* | 1/2009 | Itamura | ................ | H01G 4/2325 361/321.3 |
| 2011/0001399 A1 | 1/2011 | Oguni et al. | | |
| 2011/0265564 A1* | 11/2011 | Acar | ................... | G01C 19/5712 73/504.08 |
| 2012/0188684 A1* | 7/2012 | Akazawa | ............... | H01G 4/012 361/321.2 |
| 2012/0236463 A1* | 9/2012 | Haruki | ..................... | H01G 2/06 361/308.1 |
| 2012/0258636 A1* | 10/2012 | Horikawa | ............. | H01R 12/52 439/660 |
| 2013/0208401 A1* | 8/2013 | Shirakawa | ............. | H01G 13/06 361/305 |
| 2013/0242462 A1 | 9/2013 | Kawano et al. | | |
| 2014/0292141 A1* | 10/2014 | Nishisaka | ........... | H01F 17/0013 310/311 |
| 2015/0041198 A1* | 2/2015 | Lee | .......... | H01G 2/06 174/260 |
| 2015/0287532 A1* | 10/2015 | Abe | ...................... | H01G 4/224 174/260 |

FOREIGN PATENT DOCUMENTS

| | | | |
|---|---|---|---|
| JP | 1-289231 A | 11/1989 | |
| JP | 9-270342 A | 10/1997 | |
| JP | 10-233121 A * | 9/1998 | ............... H01B 5/02 |
| JP | 2002-158137 A | 5/2002 | |
| JP | 2005-108966 A | 4/2005 | |
| JP | 2005-243835 A | 9/2005 | |
| JP | 2011-014698 A | 1/2011 | |
| JP | 2013-197186 A | 9/2013 | |

* cited by examiner

MONOLITHIC CERAMIC ELECTRONIC COMPONENT

BACKGROUND OF THE INVENTION

1. Field of the Invention

The present invention relates to a monolithic ceramic electronic component, and particularly to, for example, a monolithic ceramic electronic component in which outer electrodes are provided on both end surfaces of a multilayer body.

2. Description of the Related Art

In recent years, a large number of electronic components such as ceramic electronic components have come to be mounted on circuit substrates installed in electronic equipment. For mounting such electronic components on circuit substrates, Pb-containing solder has been commonly used. However, in recent years, in order to reduce environmental loads, studies on Pb-free mounting of electronic components have been increasingly performed.

In a known example of a Pb-free method of mounting electronic components on circuit substrates, electronic components are mounted with Pb-free solder or a conductive adhesive containing a thermosetting resin such as an epoxy thermosetting resin and conductive fine particles such as metal filler. A monolithic ceramic electronic component that is suitable for such mounting includes a ceramic body having inner electrodes formed of Ni or Ni alloy, and has, on the end surfaces of the ceramic body, outer electrodes each constituted by a lower electrode mainly formed of Cu or Cu alloy and an overlying outermost electrode layer mainly formed of Ag or Ag alloy. In such an electronic component, by forming Ag-containing electrode layers as outermost electrode layers of outer electrodes, the outer electrodes have enhanced compatibility with conductive adhesive to thereby increase the mounting strength of the electronic component (refer to Japanese Unexamined Patent Application Publication No. 2002-158137, for example).

However, in the monolithic ceramic electronic component described in Japanese Unexamined Patent Application Publication No. 2002-158137, electrochemical migration of Ag may cause short circuit failures between outer electrodes. In particular, for example, in the cases where electronic components are used within or near ECUs (electric control units) of automobiles, the atmosphere around electronic components may have a high temperature of 150° C. or more. In such an atmosphere, short circuit failures easily occur in the monolithic ceramic electronic component described in Japanese Unexamined Patent Application Publication No. 2002-158137 due to electrochemical migration of Ag.

As illustrated in FIG. 6, a conductive adhesive 3 is applied to lands 2 of a circuit substrate 1 and a monolithic ceramic electronic component 4 is mounted on the conductive adhesive 3. At this time, the monolithic ceramic electronic component 4 presses down on the conductive adhesive 3. This may cause the conductive adhesive 3 to spread to the surface of a ceramic body 5 or to the space between the ceramic body 5 and the circuit substrate 1; or a capillary phenomenon may cause the conductive adhesive 3 to move along the surface of the ceramic body 5. As a result, the conductive adhesive 3 may form a connection between outer electrodes 6, causing short circuit failures.

SUMMARY OF THE INVENTION

Accordingly, preferred embodiments of the present invention provide a monolithic ceramic electronic component in which electrochemical migration of Ag is prevented and also prevents short circuit failures that are caused during mounting by unintended movement of conductive adhesive or formation of a connection between outer electrodes through conductive adhesive.

A monolithic ceramic electronic component according to a preferred embodiment of the present invention includes a ceramic body that includes a stack of a plurality of ceramic layers and includes opposing main surfaces, opposing side surfaces, and opposing end surfaces; inner electrodes that are disposed within the ceramic body and include exposed portions at the end surfaces of the ceramic body; and a pair of outer electrodes that is arranged on the end surfaces of the ceramic body so as to be connected to the exposed portions of the inner electrodes and so as to extend from the end surfaces of the ceramic body to the main surfaces and the side surfaces of the ceramic body, wherein each of the outer electrodes includes a lower electrode layer provided on the ceramic body, an intermediate electrode layer located on the lower electrode layer and defined by a plated Ni layer, and an upper electrode layer located on the intermediate electrode layer and defined by a plated Pd or Pd—Ni alloy layer, and a thickness of the intermediate electrode layer on the main surfaces and the side surfaces of the ceramic body is larger than a thickness of the intermediate electrode layer on the end surfaces of the ceramic body.

By forming, as the outermost layers of outer electrodes, Pd electrodes or Pd—Ni alloy electrodes, which do not contain Ag, electrochemical migration is prevented even in the monolithic ceramic electronic component that is capable of being mounted with conductive adhesive. In addition, the thickness of the intermediate electrode layer on the main surfaces and the side surfaces of the ceramic body is preferably larger than the thickness of the intermediate electrode layer on the end surfaces of the ceramic body. Thus, outer electrodes include large-thickness portions that are to be brought into contact with adhesive on the mounting surface of the circuit substrate. As a result, a sufficiently large distance (standoff) is ensured between the lowermost point of outer electrodes in the mounting surface of the monolithic ceramic electronic component to the surface of the ceramic body. Accordingly, when such a monolithic ceramic electronic component is mounted on a circuit substrate with conductive adhesive, spreading (movement) of the conductive adhesive over the monolithic ceramic electronic component is significantly reduced or prevented. Thus, a monolithic ceramic electronic component in which short circuit failures are significantly reduced or prevented is provided. By forming, as the outermost layers of outer electrodes, Pd electrodes or Pd—Ni alloy electrodes, the monolithic ceramic electronic component is also applicable to solder mounting or wire-bonding mounting and is also applicable to, for example, mounting combined with conductive-adhesive mounting (for example, a combination of conductive-adhesive mounting and wire-bonding mounting).

In such a monolithic ceramic electronic component, a ratio of the thickness of the intermediate electrode layer on the main surfaces and the side surfaces of the ceramic body to the thickness of the intermediate electrode layer on the end surfaces of the ceramic body is preferably about 120% or more and about 300% or less, for example.

When the ratio of the thickness of the intermediate electrode layers on the main surfaces and the side surfaces of the ceramic body to the thickness of the intermediate electrode layers on the end surfaces of the ceramic body is less than about 120%, a sufficiently large distance cannot be ensured from the lowermost point of outer electrodes in the mounting surface of the monolithic ceramic electronic component to the surface of the ceramic body. Accordingly, there is a possibility that, for example, spreading of the conductive adhesive during mounting cannot be suppressed or prevented. When the ratio of the thickness of the intermediate electrode layers on the main surfaces and the side surfaces of the ceramic body to the thickness of the intermediate electrode layers on the end surfaces of the ceramic body is more than about 300%, during a temperature-cycling test, tensile stress of the plating layers may cause generation of cracks in the ceramic body.

A mounting structure of a monolithic ceramic electronic component according to a preferred embodiment of the present invention includes a monolithic ceramic electronic component including a ceramic body that includes a stack of a plurality of ceramic layers and opposing main surfaces, opposing side surfaces, and opposing end surfaces, inner electrodes that are disposed within the ceramic body and include exposed portions at the end surfaces of the ceramic body, and a pair of outer electrodes that is arranged on the end surfaces of the ceramic body so as to be connected to the exposed portions of the inner electrodes and so as to extend from the end surfaces of the ceramic body to the main surfaces and the side surfaces of the ceramic body, wherein each of the outer electrodes includes a lower electrode layer provided on the ceramic body, an intermediate electrode layer located on the lower electrode layer and defined by a plated Ni layer, and an upper electrode layer located on the intermediate electrode layer and defined by a plated Pd or Pd—Ni alloy layer, and a thickness of the intermediate electrode layer on the main surfaces and the side surfaces of the ceramic body is larger than a thickness of the intermediate electrode layer on the end surfaces of the ceramic body; a mounting substrate including a pair of lands electrically connected to the pair of outer electrodes; and a pair of conductive adhesives bonding the pair of outer electrodes and the pair of lands of the mounting substrate, wherein the pair of outer electrodes is mounted on the mounting substrate with the pair of conductive adhesives, and a distance (standoff) from a lowermost point of the outer electrodes on a mounting surface of the monolithic ceramic electronic component to a surface of the ceramic body preferably is about 10.1 μm or more and about 20.1 μm or less, for example.

The outer electrodes of the monolithic ceramic electronic component are connected to the lands of the mounting substrate via conductive adhesives to provide a mounting structure of the monolithic ceramic electronic component. Such conductive adhesive has a composition in which a thermosetting resin such as an epoxy resin is mixed with a metal filler such as Ag filler. The outer electrodes of the monolithic ceramic electronic component are located on the lands of the mounting substrate with flowable conductive adhesive therebetween and heating is performed to cure the conductive adhesive. Thus, the outer electrodes are bonded to the lands. Prior to the heating, the conductive adhesive has flowability. Accordingly, when the outer electrodes are pressed down on the lands via the conductive adhesive, the conductive adhesive spreads to the surface of a ceramic body or to the space between the ceramic body and the mounting substrate, or a capillary phenomenon causes the conductive adhesive to move along the surface of the ceramic body. However, such spreading (movement) of the conductive adhesive during mounting of the monolithic ceramic electronic component is suppressed in the following manner: the intermediate electrode layers are configured to have a larger thickness on the main surfaces and the side surfaces of the ceramic body than on the end surfaces of the ceramic body; and a sufficiently large distance (standoff) preferably in the range of about 10.1 μm or more and about 20.1 μm or less, for example, is ensured from the lowermost point of the outer electrodes on a mounting surface of the monolithic ceramic electronic component to the surface of the ceramic body. As a result, a mounting structure of a monolithic ceramic electronic component in which short circuit failures are significantly reduced or prevented is provided.

Various preferred embodiments of the present invention provide a monolithic ceramic electronic component in which, during mounting of the monolithic ceramic electronic component on a circuit substrate, unintended movement of conductive adhesive and the resultant short circuit failures are significantly reduced or prevented and electrochemical migration of Ag does not occur.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
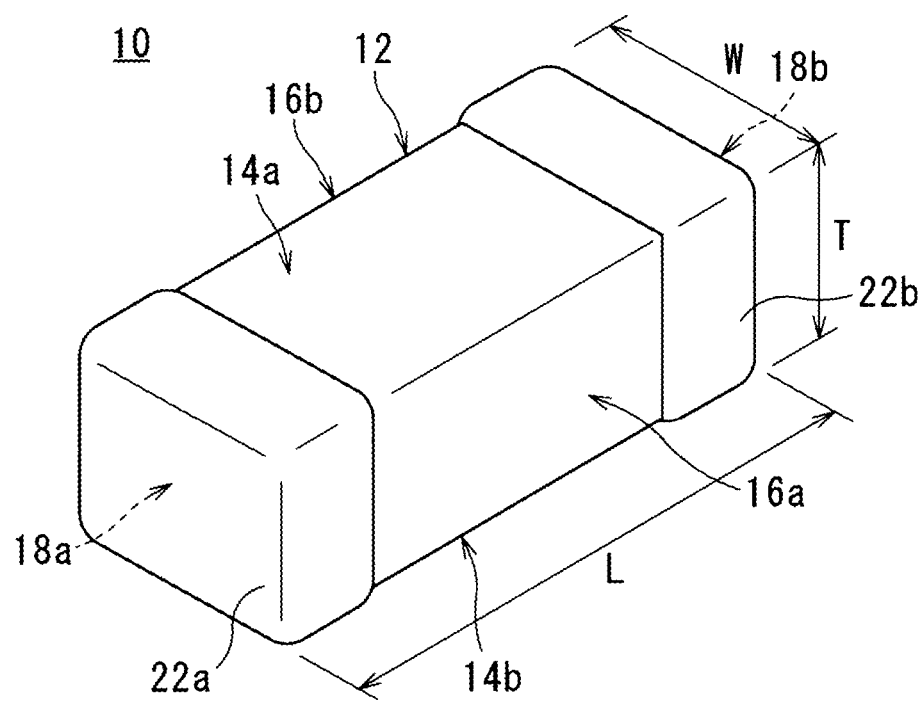
FIG. 1 is a perspective view of a monolithic ceramic capacitor serving as an example of a monolithic ceramic electronic component according to a preferred embodiment of the present invention.
Figure 2:
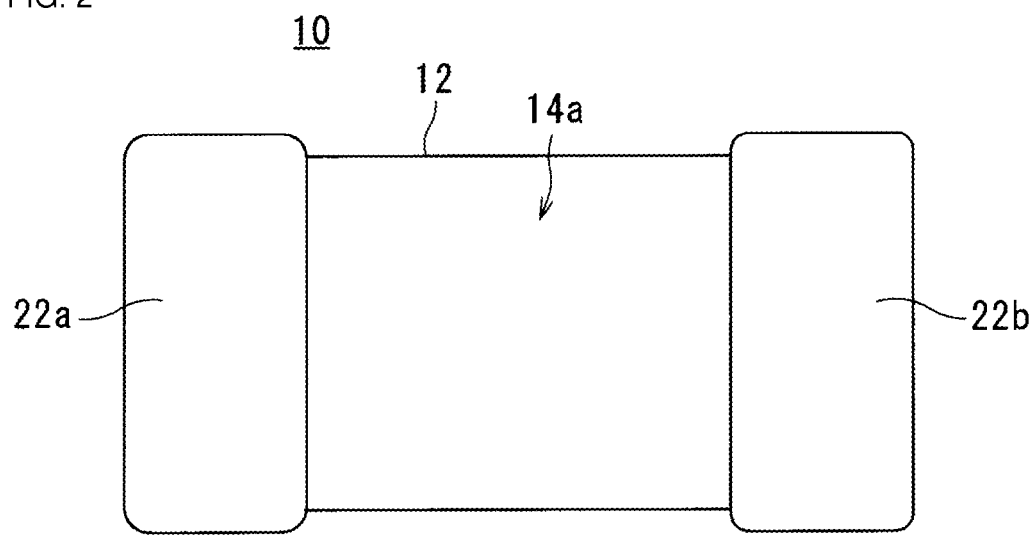
FIG. 2 is a plan view of the monolithic ceramic capacitor in FIG. 1.

FIG. 1 is a perspective view of a monolithic ceramic capacitor serving as an example of a monolithic ceramic electronic component according to a preferred embodiment of the present invention. FIG. 2 is a plan view of this monolithic ceramic capacitor. A monolithic ceramic capacitor 10 includes a ceramic body 12 that has a rectangular or substantially rectangular parallelepiped shape. The ceramic body 12 includes a pair of opposing main surfaces 14a and 14b (surfaces defined by length L and width W), a pair of opposing side surfaces 16a and 16b (surfaces defined by length L and thickness T), and a pair of opposing end surfaces 18a and 18b (surfaces defined by width W and thickness T). In this case, the ceramic body 12 preferably has rounded corners and rounded ridges. In FIG. 1, the ceramic body preferably has a rectangular or substantially rectangular parallelepiped shape. Alternatively, depending on the type of the monolithic ceramic electronic component, the ceramic body 12 may have a shape other than rectangular or substantially rectangular parallelepiped shapes.

The ceramic body 12 may be formed of a dielectric ceramic containing, as a main component, for example, $BaTiO_3$, $CaTiO_3$, $SrTiO_3$, or $CaZrO_3$. Such a main component may be mixed with an auxiliary component such as a Mn compound, an Fe compound, a Cr compound, a Co compound, or a Ni compound. Alternatively, the ceramic body 12 may be formed of, for example, a piezoelectric ceramic such as PZT ceramic, a semiconductor ceramic such as spinel ceramic, or a magnetic ceramic such as ferrite.

Figure 3:
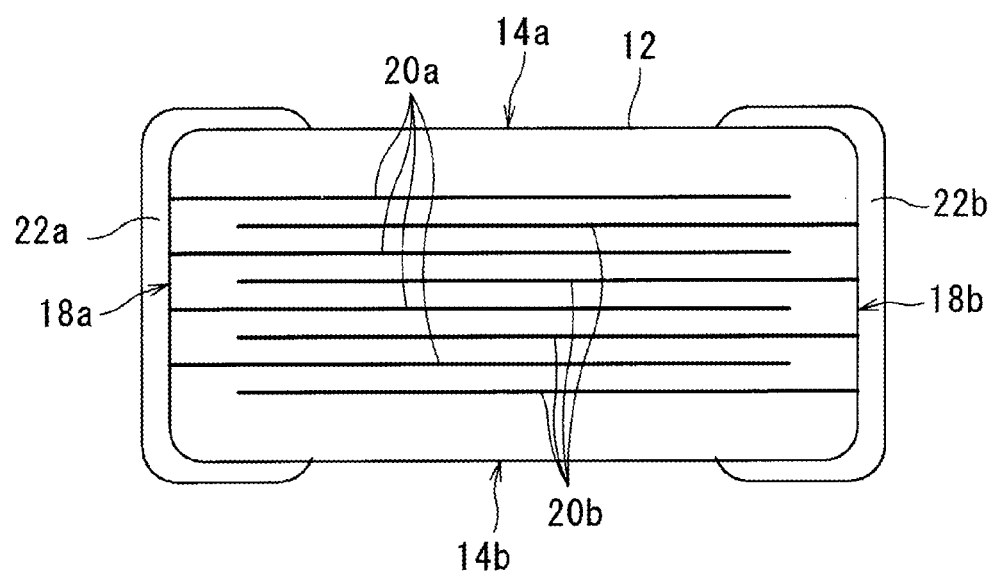
FIG. 3 is a sectional view of the monolithic ceramic capacitor in FIG. 1.

As illustrated in FIG. 3, the ceramic body 12 includes first inner electrodes 20a and second inner electrodes 20b, which have a rectangular or substantially rectangular shape and are alternately disposed at regular intervals in the thickness T direction of the ceramic body 12. End portions of the first inner electrodes 20a are exposed at one end surface 18a of the ceramic body 12. End portions of the second inner electrodes 20b are exposed at the other end surface 18b of the ceramic body 12. The main surfaces of the first inner electrodes 20a and the main surfaces of the second inner electrodes 20b are disposed so as to be parallel or substantially parallel with the main surfaces 14a and 14b of the ceramic body 12 and so as to be parallel or substantially parallel with one another. Thus, the first inner electrodes 20a oppose adjacent second inner electrodes 20b with ceramic layers therebetween in the thickness T direction of the ceramic body 12.

The thicknesses of the first inner electrodes 20a and the second inner electrodes 20b are not particularly limited. The first inner electrodes 20a and the second inner electrodes 20b each may preferably have a thickness of, for example, about 0.2 μm to about 2 μm. Examples of a material for the first inner electrodes 20a and the second inner electrodes 20b include metals such as Ni, Cu, Ag, Pd, and Au and alloys containing one or more of these metals, such as Ag—Pd alloy.

In the ceramic body 12 according to this preferred embodiment, the first inner electrodes 20a and the second inner electrodes 20b are disposed so as to be parallel or substantially parallel with each other with dielectric ceramic layers therebetween, so that the ceramic body 12 defines and serves as a ceramic body for a monolithic ceramic capacitor. Instead of the dielectric ceramic layers, in the case of using piezoelectric ceramic layers, the ceramic body 12 defines and serves as a piezoelectric component; in the case of using semiconductor ceramic layers, the ceramic body 12 defines and serves as a thermistor; and, in the case of using magnetic ceramic layers, the ceramic body 12 defines and serves as an inductor. Such a ceramic layer preferably has a thickness of about 0.5 μm to about 10 μm, for example.

Figure 4:
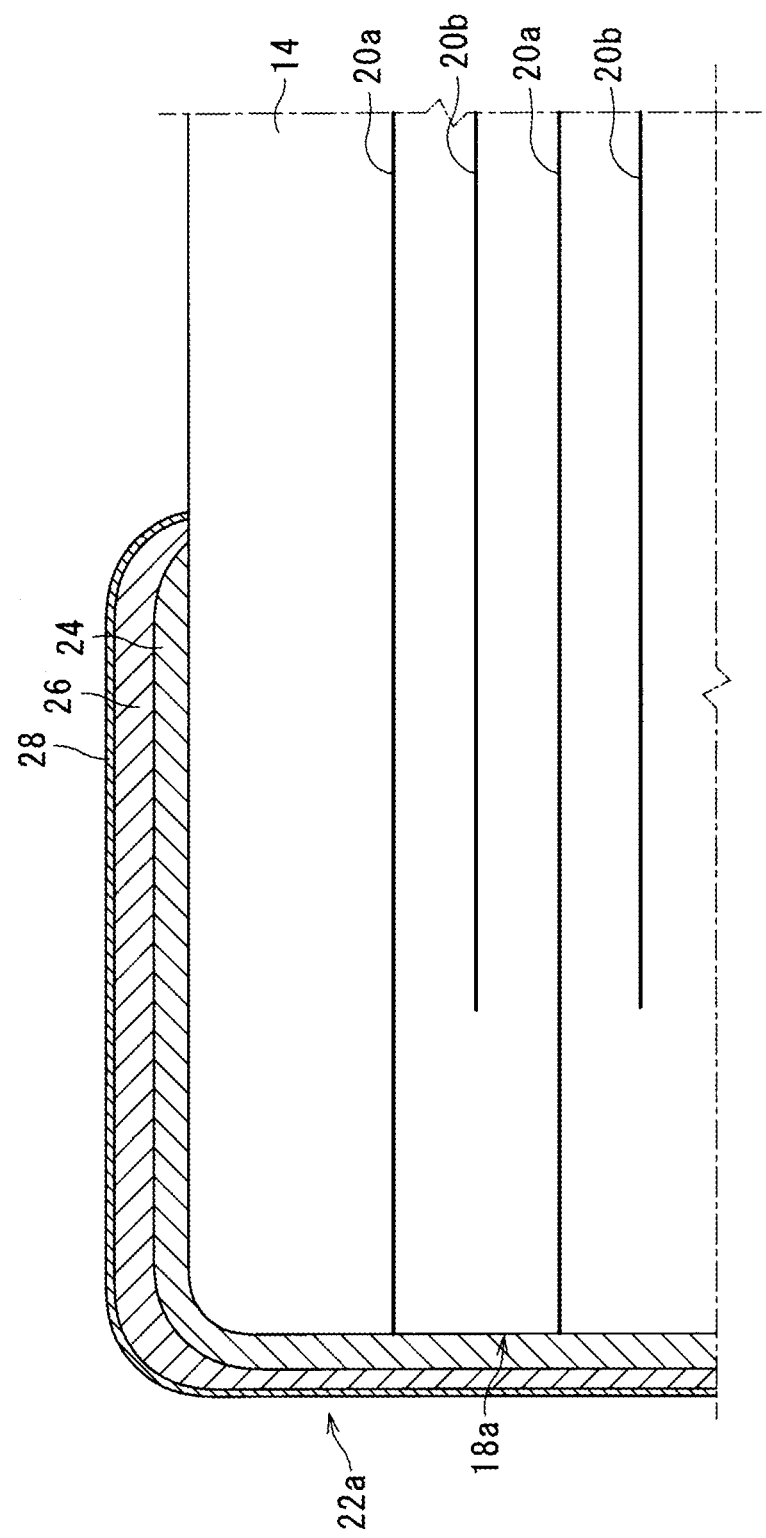
FIG. 4 illustrates the structure of an outer electrode of the monolithic ceramic capacitor in FIG. 1.

A first outer electrode 22a is provided on the first end surface 18a of the ceramic body 12. A second outer electrode 22b is provided on the second end surface 18b of the ceramic body 12. The first outer electrode 22a is arranged so as to extend from the first end surface 18a of the ceramic body 12 to the main surfaces 14a and 14b and the side surfaces 16a and 16b. The second outer electrode 22b is arranged so as to extend from the second end surface 18b of the ceramic body 12 to the main surfaces 14a and 14b and the side surfaces 16a and 16b. As illustrated in FIG. 4, the first outer electrode 22a and the second outer electrode 22b each include a lower electrode layer 24, an intermediate electrode layer 26 provided on the lower electrode layer 24, and an upper electrode layer 28 provided on the intermediate electrode layer 26. In FIG. 4, one of the outer electrodes, the outer electrode 22a is illustrated; however, the other one of outer electrodes, the outer electrode 22b has the same configuration as in FIG. 4.

The lower electrode layers 24 are configured so as to be connected to the first inner electrodes 20a and the second inner electrodes 20b exposed at the end surfaces 18a and 18b of the ceramic body 12. The lower electrode layers 24 contain a glass component and a metal component. Examples of a metal used for the lower electrode layers 24 include Cu, Ni, Ag, Pd, Ag—Pd alloy, and Au. During mounting, the bottom surface portions (for example, on the main surface 14a or 14b side of the ceramic body 12) of the lower electrode layers 24 preferably have a thickness of about 1 μm to about 15 μm, for example.

The intermediate electrode layers 26 are formed as Ni plating films. As a result of the formation of Ni plating films, immersion in Pd plating bath for forming Pd plating films serving as the upper electrode layers 28 on the intermediate electrode layers 26 does not cause dissolution of the lower electrode layers 24 in the Pd plating bath. In addition, the Ni plating films cover the lower electrode layers 24 having surfaces that are difficult to plate, such as portions having irregularities and glass-component segregated portions, to thus provide smooth surfaces. Thus, adhesion of the upper electrode layers 28 is enhanced so that these Pd plating films have a small thickness. The intermediate electrode layers 26 provided on the end surfaces 18a and 18b of the ceramic body 12 preferably have a thickness of about 2 μm to about 10 μm, for example. The intermediate electrode layers 26 provided on the main surfaces 14a and 14b and the side surfaces 16a and 16b of the ceramic body 12 preferably have a thickness of about 5 μm to about 20 μm, for example.

The upper electrode layers 28 preferably are defined by and formed as Pd plating films or Pd—Ni alloy films. By forming Pd plating films or Pd—Ni alloy films as the outermost layers of the first outer electrode 22a and the second outer electrode 22b, reliability of establishing an electric connection with metal filler such as Ag filler used for conductive adhesive for mounting on a circuit substrate is ensured. Thus, the monolithic ceramic capacitor 10 preferably is mounted with conductive adhesive. When the upper electrode layers 28 are formed by plating with a base metal such as Sn, problems of galvanic corrosion and oxidation occur and the connection reliability is not ensured. In addition, Pd plating films and Pd—Ni alloy films do not contain Ag and hence electrochemical migration is significantly reduced and prevented. The upper electrode layers 28 preferably have a thickness of about 0.01 μm to about 0.5 μm, for example.

The intermediate electrode layers 26 have a larger thickness on the main surfaces 14a and 14b and the side surfaces 16a and 16b of the ceramic body 12 than on the end surfaces 18a and 18b of the ceramic body 12. Thus, without unnecessarily increasing the length dimension of the monolithic ceramic capacitor 10, the thickness of the outer electrodes 22a and 22b is increased in the circuit-substrate-mounting surface of the monolithic ceramic capacitor 10.

Figure 5:
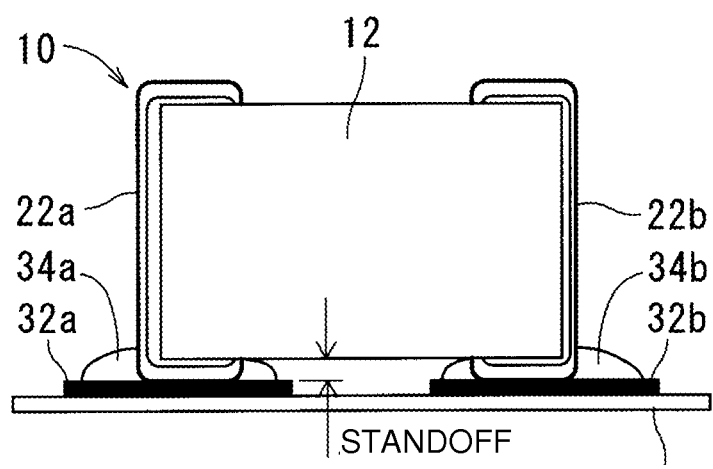
FIG. 5 illustrates a monolithic ceramic electronic component mounted on a circuit substrate.
Figure 6:
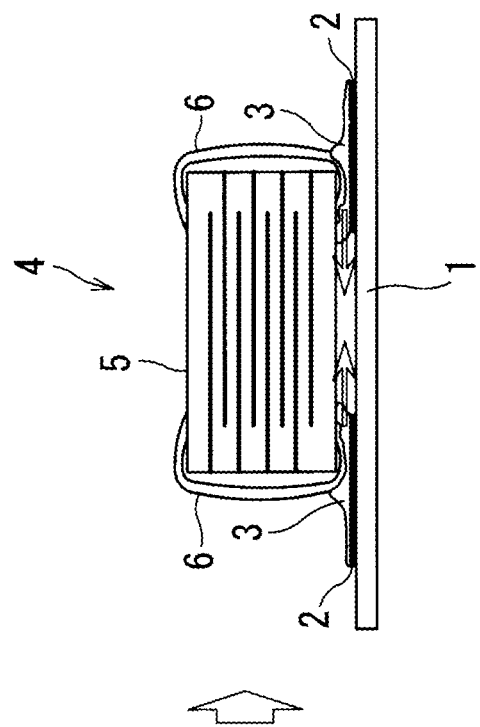
FIG. 6 illustrates the movement of conductive adhesive caused during mounting of a monolithic ceramic electronic component on a circuit substrate with conductive adhesive.

As illustrated in FIG. 5, the monolithic ceramic capacitor 10 is mounted such that the main surfaces 14a and 14b or the side surfaces 16a and 16b of the ceramic body 12 oppose a circuit substrate 30 defining and serving as a mounting substrate. Specifically, the first outer electrode 22a and the second outer electrode 22b of the monolithic ceramic capacitor 10 are located on a first land 32a and a second land 32b located on the circuit substrate 30; and the outer electrodes 22a and 22b are fixed to the lands 32a and 32b with a first conductive adhesive 34a and a second conductive adhesive 34b.

The conductive adhesives 34a and 34b have a composition in which a thermosetting resin such as an epoxy resin is mixed with a metal filler such as Ag filler. During bonding of the outer electrodes 22a and 22b to the lands 32a and 32b, the outer electrodes 22a and 22b are provided on the lands 32a and 32b via uncured and flowable conductive adhesives 34a and 34b and heating is performed to cure the conductive adhesives 34a and 34b.

In the mounting structure of the monolithic ceramic capacitor 10, the intermediate electrode layers 26 are configured to have a larger thickness on the main surfaces 14a and 14b and the side surfaces 16a and 16b of the ceramic body 12 than on the end surfaces 18a and 18b of the ceramic body 12. As a result, a sufficiently large distance (standoff) is ensured from the lowermost point of outer electrodes 22a and 22b in the mounting surface of the monolithic ceramic capacitor 10 to the surface of the ceramic body 12. This standoff is preferably about 10.1 μm or more and about 20.1 μm or less, for example. When a sufficiently large standoff is thus ensured, during mounting of the monolithic ceramic capacitor 10 on the circuit substrate 30 with the conductive adhesives 34a and 34b, spreading (movement) of the conductive adhesives 34a and 34b over the monolithic ceramic capacitor 10 is significantly reduced or prevented. Note that the term "standoff" used here denotes a distance from the lowermost point of outer electrodes 22a and 22b in the mounting surface of the monolithic ceramic capacitor 10 to the surface of the ceramic body 12. In general, the term "standoff" denotes a distance from the lowermost point of outer electrodes in the mounting surface of a monolithic ceramic electronic component to the surface of the ceramic body.

In order to ensure a standoff satisfying the above-described range, the ratio of the thickness of the intermediate electrode layers 26 on the main surfaces 14a and 14b and the side surfaces 16a and 16b of the ceramic body 12 to the thickness of the intermediate electrode layers 26 on the end surfaces 18a and 18b of the ceramic body 12 is preferably about 120% or more and about 300% or less, for example. When the ratio of the thickness of the intermediate electrode layers 26 on the main surfaces 14a and 14b and the side surfaces 16a and 16b of the ceramic body 12 to the thickness of the intermediate electrode layers 26 on the end surfaces 18a and 18b of the ceramic body 12 is less than about 120%, a sufficiently large distance cannot be ensured from the lowermost point of outer electrodes 22a and 22b in the mounting surface of the monolithic ceramic capacitor 10 to the ceramic body 12. Accordingly, during mounting of the monolithic ceramic capacitor 10 on conductive adhesive, it cannot be sufficiently suppressed that the conductive adhesive being pressed spreads to the ceramic body 12 or a capillary phenomenon causes the conductive adhesive to move to the ceramic body 12. As a result, short circuit failures may be caused. When the ratio of the thickness of the intermediate electrode layers 26 on the main surfaces 14a and 14b and the side surfaces 16a and 16b of the ceramic body 12 to the thickness of the intermediate electrode layers 26 on the end surfaces 18a and 18b of the ceramic body 12 is more than about 300%, during a temperature-cycling test, tensile stress of the plating layers may cause generation of cracks in the ceramic body 12.

The thicknesses of the intermediate electrode layers 26 are preferably defined as follows: a section of the ceramic body is obtained by polishing the ceramic body 12 in the length direction of the ceramic body 12, to the central portion of the main surfaces 14a and 14b in the width direction of the ceramic body 12; in one of the outer electrodes in this section, the thickness of the intermediate electrode layer 26 on the end surface is measured on the central portion of the end surface, and the thickness of the intermediate electrode layer 26 on the main surface of the mounting-surface side of the ceramic body 12 is measured on the central portion of the main surface in the mounting-surface side.

In order to vary the thickness of the intermediate electrode layers 26 such that the thickness for the main surfaces 14a and 14b and the side surfaces 16a and 16b of the ceramic body 12 is different from the thickness for the end surfaces 18a and 18b of the ceramic body 12, for example, the following method is preferably used. In barrel plating, about ⅓ or more of the volume of the barrel is loaded with the ceramic bodies 12 and metal media such that the volume ratio of the ceramic bodies 12 to the total loading volume is about 40% or more, for example. When this barrel is rotated at a low rate of about 20 rpm or less, it is highly likely that the ceramic bodies 12 within the barrel are plated while arranged in their length direction. Thus, the plating amount on the main surfaces and the side surfaces of each ceramic body 12 becomes larger. As a result, the intermediate electrode layers 26 preferably have a larger thickness on the main surfaces 14a and 14b and the side surfaces 16a and 16b of the ceramic body 12 than on the end surfaces 18a and 18b of the ceramic body 12.

The above-described ceramic bodies 12 to be subjected to barrel plating include lower electrode layers thereon.

During mounting of the monolithic ceramic capacitor 10, the distance from the circuit-substrate-30-side surface of the ceramic body 12 to the lowermost surfaces of the outer electrodes 22a and 22b in contact with the lands 32a and 32b of the circuit substrate 30 is preferably about 10 μm to about 50 μm, for example. When the distance from the surface of the ceramic body 12 to the lowermost surfaces of the outer electrodes 22a and 22b is less than about 10 μm, the distance (total thickness of lower electrode layer, intermediate electrode layer, and upper electrode layer) from the ceramic body 12 to the lands 32a and 32b of the circuit substrate 30 is not sufficiently large. Accordingly, during mounting of the monolithic ceramic capacitor 10 on conductive adhesive, the possibility that the conductive adhesive being pressed spreads to the ceramic body 12 or a capillary phenomenon causes the conductive adhesive to move to the ceramic body 12 cannot be significantly reduced or prevented. As a result, short circuit failures may be caused. When the distance (total thickness of lower electrode layer, intermediate electrode layer, and upper electrode layer) from the surface of the ceramic body 12 to the lowermost surfaces of the outer electrodes 22a and 22b is more than about 50 μm, during a temperature-cycling test, tensile stress of the plating layers may cause generation of cracks in the ceramic body 12.

The reason why the standoff is not adjusted by controlling the thickness of the lower electrode layers 24 is that it becomes necessary to perform, several times, dipping of the ceramic body 12 in the lower electrode material, drying, and baking, which result in high production costs. The reason why the standoff is not adjusted by controlling the thickness of the upper electrode layers 28 is that the cost incurred for the Pd material becomes high.

In order to produce the monolithic ceramic capacitor 10, ceramic green sheets containing a ceramic material used to form the ceramic body 12 are prepared. Subsequently, on some of the ceramic green sheets, a conductive paste is applied to form conductive patterns corresponding to the first inner electrodes 20a and the second inner electrodes 20b. This conductive paste can be applied by a method selected from various printing methods, such as screen printing. The conductive paste may contain, in addition to conductive fine particles, a known binder or a known solvent.

A plurality of ceramic green sheets not having conductive patterns thereon, the ceramic green sheets having conductive patterns corresponding to the first and second inner electrodes 20a and 20b, and a plurality of ceramic green sheets not having conductive patterns thereon are stacked in this order and pressed in the stack direction. Thus, a mother multilayer body is produced.

The mother multilayer body is cut along imaginary cutting lines thereon to provide a plurality of green ceramic bodies. The mother multilayer body can be cut by dicing or press-cutting. Such a green ceramic body may be subjected to, for example, barrel tumbling to round the ridges and corners of the green ceramic body.

The green ceramic body is fired to provide the ceramic body 12 including the first inner electrodes 20a and the second inner electrodes 20b. The firing temperature may be, for example, about 900° C. to about 1300° C.

A metal paste is applied, for example, by dipping, to the end surfaces 18a and 18b of the fired ceramic body 12 so as to extend to the main surfaces 14a and 14b and the side surfaces 16a and 16b of the ceramic body 12. The applied metal paste is baked to form the lower electrode layers 24. The metal paste is preferably baked at about 700° C. to about 900° C., for example.

On the lower electrode layers 24, the intermediate electrode layers 26 are formed. At this time, by setting the loading amount of the monolithic ceramic bodies 12 to a relatively large amount, the intermediate electrode layers 26 can be formed so as to have a larger thickness on the main surfaces and the side surfaces of the ceramic bodies 12. Specifically, in barrel plating, about ⅓ or more of the volume of the barrel is loaded with the ceramic bodies 12 and metal media such that the volume ratio of the ceramic bodies 12 to the total volume of the ceramic bodies 12 and metal media is about 40% or more, for example. When this barrel is rotated at a low rate of about 20 rpm or less, for example, it is highly likely that the ceramic bodies 12 within the barrel are plated while arranged in their length direction. Thus, the plating amount on the main surfaces and the side surfaces of each ceramic body 12 becomes larger. As a result, the intermediate electrode layers 26 are preferably formed so as to have a larger thickness on the main surfaces 14a and 14b and the side surfaces 16a and 16b of the ceramic body 12 than on the end surfaces 18a and 18b of the ceramic body 12.

The above-described ceramic bodies 12 to be subjected to barrel plating include lower electrode layers thereon.

The upper electrode layers 28 are provided. Thus, the monolithic ceramic capacitor 10 is produced, on the intermediate electrode layers 26.

In the monolithic ceramic capacitor 10, the upper electrode layers 28 of the first outer electrode 22a and the second outer electrode 22b are preferably formed of Pd or Pd—Ni alloy. Accordingly, electrochemical migration of Ag does not occur. In addition, the outer electrodes 22a and 22b are arranged on the main surfaces, the side surfaces, and the end surfaces of the ceramic body 12 so as to have thicknesses that satisfy a ratio within a certain range. As a result, during mounting of the monolithic ceramic capacitor 10 on the circuit substrate 30, spreading or movement of the conductive adhesive is reliably prevented. In addition, generation of cracks in the ceramic body 12 due to stress of the outer electrodes 22a and 22b is also significantly reduced or prevented. Accordingly, a monolithic ceramic electronic component is provided in which short circuit failures tend not to occur; and a mounting structure is provided in which a monolithic ceramic electronic component mounted on the circuit substrate 30 tends not to be damaged.

EXAMPLES

An example of a ceramic body for a monolithic ceramic capacitor was prepared. This ceramic body included ceramic layers formed of $BaTiO_3$ and inner electrodes formed of Ni and had chip dimensions (L×W×T) of approximately 1.0 mm×0.5 mm×0.5 mm. Lower electrode layers were formed of Cu and had a thickness of about 30 μm on the central portions of the end surfaces of the ceramic body and had a thickness of about 5 μm on the main surfaces and the side surfaces of the ceramic body. Intermediate electrode layers had a thickness of about 5 μm on the central portions of the end surfaces of the ceramic body. Upper electrode layers had a thickness of about 0.1 μm on the central portions of the end surfaces of the ceramic body and had a thickness of about 0.1 μm on the main surfaces and the side surfaces of the ceramic body. The intermediate electrode layers were formed as Ni plating layers by Ni plating in Watts bath with about 0.5-mm-diameter media for approximately 60 minutes. The other plating conditions are described in Table 1. The upper electrode layers were formed as Pd plating layers by Pd plating in electroplating Pd bath with about 0.5-mm-diameter media for approximately 20 minutes. In addition to the above-described plating conditions, control was performed in terms of a ceramic-body-loading ratio in the barrel during formation of the intermediate electrode layers by plating and the ratio of volume of ceramic bodies/total volume of ceramic bodies and metal media. In this way, the intermediate electrode layers were formed so as to satisfy the target ratio (%) of main-surface-and-side-surface thickness to end-surface thickness.

Monolithic ceramic capacitors were produced as Examples 1 to 5 such that, in the ceramic bodies, the ratio of main-surface-and-side-surface thickness to end-surface thickness of the intermediate electrode layers was varied as described in Table 1. Another monolithic ceramic capacitor was produced as Comparative example 1 such that the intermediate electrode layers had the same thickness on the main surfaces, the side surfaces, and the end surfaces of the ceramic body. Another monolithic ceramic capacitor was produced as Comparative example 2 such that the ratio of main-surface-and-side-surface thickness to end-surface thickness of the intermediate electrode layers of the ceramic body was beyond the upper limit defined in a preferred embodiment of the present invention. Another monolithic ceramic capacitor was produced as Comparative example 3: outer electrodes were formed that were each constituted by a Cu lower electrode layer and an overlying Ag—Pd alloy thick electrode film; and the outer electrodes had a thickness of about 50 μm on the central portions of the end surfaces of the ceramic body and had a thickness of about 5 μm on the main surfaces and the side surfaces of the ceramic body.

Each of the samples prepared above was mounted, with conductive adhesives 34a and 34b, on first and second Ag lands 32a and 32b formed on the upper surface of an alumina circuit substrate 30. The conductive adhesives 34a and 34b contained about 50 vol % of Ag powder in an epoxy resin. Uncured conductive adhesives 34a and 34b were applied to the first and second lands 32a and 32b. After that, each sample was placed on the conductive adhesives 34a and 34b and heating was performed at about 140° C. for approximately 30 minutes to cure the conductive adhesives 34a and 34b. Thus, the mounting structures of the samples were obtained.

The thicknesses of the intermediate electrode layers were measured as follows: a section of each sample was obtained by polishing the sample in the length L direction of the sample, to the central portion of the main surfaces in the width direction of the sample; for one of the outer electrodes in this section, an optical microscope was used to measure the thickness of the intermediate electrode layer on the central portion of the end surface and the thickness of the intermediate electrode layer in the central portion of the outer electrode on the mounting-surface side of the sample. From these measured thicknesses, the ratio was calculated.

The monolithic ceramic capacitors were evaluated in terms of occurrence of electrochemical migration, occurrence of short circuit failures, and generation of cracks caused by a thermal shock cycling test.

The evaluation in terms of occurrence of electrochemical migration was performed as follows. Each sample was subjected to a high temperature loading test at about 150° C. under application of about 32 V for approximately 2000 hours. After the test, the sample was observed as to whether the ceramic body defining and serving as the inter-electrode portion of the sample discolored or not; and the length of dendrites was measured. A sample in which the inter-electrode portion of the sample discolored and dendrites had a length of about 50 µm or more was evaluated as a sample in which electrochemical migration occurred.

The evaluation in terms of occurrence of short circuit failures was performed as follows. The resistance of each sample was measured with an IR meter (SS-867) at about 25V DC. A sample having a resistance of about 1 MΩ or less was evaluated as a sample in which short circuit failures occurred. The number ratio of samples in which short circuit failures occurred to all the samples evaluated is described as a ratio of occurrence of short circuit.

The evaluation in terms of generation of cracks caused by a thermal shock cycling test was performed as follows. The thermal shock cycling test was performed by 2000 cycles of holding a sample at about −55° C. for approximately 30 minutes in an air chamber and holding the sample at about 150° C. for approximately 30 minutes in an air chamber.

After the thermal shock cycling test was performed, the sample was polished in a direction perpendicular to the substrate-mounting surface and in the length direction of the sample, to the central portion of the main surfaces in the width direction of the sample. The resultant polished surface was observed with a metallographic microscope at a magnification of 100 to 500 as to whether cracks extending from the edge of bent portions of outer electrodes to the ceramic region were generated or not.

The standoff distance was determined by measuring, with a laser displacement meter, the distance from a possible mounting surface of the ceramic body to the point of outer electrodes that is farthest from the possible mounting surface of the ceramic body in the thickness direction of the outer electrodes formed on the possible mounting surface of the ceramic body. Each value in Table 1 is the average of values of 20 samples.

TABLE 1

|  | Comparative example 1 | Example 1 | Example 2 | Example 3 | Example 4 | Example 5 | Comparative example 2 | Comparative example 3 |
|---|---|---|---|---|---|---|---|---|
| Ceramic-body-loading ratio in barrel (%) | 30 | 30 | 30 | 30 | 30 | 35 | 40 | Ag—Pd thick electrode film |
| Volume of ceramic bodies/total volume of ceramic bodies and metal media (%) | 10 | 30 | 40 | 50 | 60 | 65 | 70 | |
| End-surface thickness of intermediate electrode layer (µm) | 5 | 5 | 5 | 5 | 5 | 5 | 5 | |
| Main-surface-and-side-surface thickness/end-surface thickness of intermediate electrode layer (%) | 100 | 120 | 150 | 200 | 250 | 300 | 320 | |
| Standoff height (µm) | 10.1 | 11.1 | 12.6 | 15.1 | 17.6 | 20.1 | 21.1 | 10.1 |
| Number of samples in which electrochemical migration occurred | 0/20 | 0/20 | 0/20 | 0/20 | 0/20 | 0/20 | 0/20 | 2/20 |
| Number of samples in which short circuit failures occurred due to movement of conductive adhesive | 3/20 | 0/20 | 0/20 | 0/20 | 0/20 | 0/20 | 0/20 | 3/20 |
| Number of samples in which cracks were generated in thermal shock cycling test | 0/20 | 0/20 | 0/20 | 0/20 | 0/20 | 0/20 | 2/20 | 0/20 |

As indicated in Table 1, according to preferred embodiments of the present invention, the outermost layers of outer electrodes are defined by Pd electrodes not containing Ag. As a result, while such a component is applicable to mounting with conductive adhesive, the occurrence of electrochemical migration is significantly reduced or prevented. In addition, the intermediate electrode layers are preferably configured to have a larger thickness on the main surfaces and the side surfaces of the ceramic body than on the end surfaces of the ceramic body, so that the outer electrodes have a large thickness in the substrate-mounting surface. As a result, a sufficiently large distance (standoff) is ensured from the lowermost point of outer electrodes in the mounting surface of the monolithic ceramic electronic component to the surface of the ceramic body. Accordingly, when such a monolithic ceramic electronic component is mounted on a circuit substrate with conductive adhesive, spreading (movement) of the conductive adhesive over the monolithic ceramic electronic component is significantly reduced or prevented. Thus, monolithic ceramic electronic components in which short circuit failures tend not to occur are provided.

The ceramic bodies in Table 1 had lower electrode layers thereon.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A monolithic ceramic electronic component comprising:
   a ceramic body including a stack of a plurality of ceramic layers, opposing main surfaces, opposing side surfaces, and opposing end surfaces;
   inner electrodes disposed within the ceramic body and including exposed portions at the end surfaces of the ceramic body; and
   a pair of outer electrodes arranged on the end surfaces of the ceramic body so as to be connected to the exposed portions of the inner electrodes and so as to extend from the end surfaces of the ceramic body to the main surfaces and the side surfaces of the ceramic body; wherein
   each of the outer electrodes includes a lower electrode layer located on the ceramic body, an intermediate electrode layer located on the lower electrode layer and defined by a plated Ni layer, and an upper electrode layer located on the intermediate electrode layer and defined by a plated Pd or Pd—Ni alloy layer; and
   a thickness of the intermediate electrode layer on the main surfaces and the side surfaces of the ceramic body is larger than a thickness of the intermediate electrode layer on the end surfaces of the ceramic body.

2. The monolithic ceramic electronic component according to claim 1, wherein a ratio of the thickness of the intermediate electrode layer on the main surfaces and the side surfaces of the ceramic body to the thickness of the intermediate electrode layer on the end surfaces of the ceramic body is about 120% or greater and about 300% or less.

3. The monolithic ceramic electronic component according to claim 1, wherein the plurality of ceramic layers are made of one of a dielectric ceramic, a piezoelectric ceramic, a semiconductor ceramic, and a magnetic ceramic.

4. The monolithic ceramic electronic component according to claim 1, wherein the monolithic ceramic electronic component is one of a piezoelectric component, a thermistor, and an inductor.

5. A mounting structure of a monolithic ceramic electronic component, the mounting structure comprising:
   a monolithic ceramic electronic component including:
      a ceramic body including a stack of a plurality of ceramic layers, opposing main surfaces, opposing side surfaces, and opposing end surfaces;
      inner electrodes that are disposed within the ceramic body and include exposed portions at the end surfaces of the ceramic body; and
      a pair of outer electrodes arranged on the end surfaces of the ceramic body so as to be connected to the exposed portions of the inner electrodes and so as to extend from the end surfaces of the ceramic body to the main surfaces and the side surfaces of the ceramic body; wherein
      each of the outer electrodes includes a lower electrode layer located on the ceramic body, an intermediate electrode layer located on the lower electrode layer and defined by a plated Ni layer, and an upper electrode layer located on the intermediate electrode layer and defined by a plated Pd or Pd—Ni alloy layer; and
      a thickness of the intermediate electrode layer on the main surfaces and the side surfaces of the ceramic body is larger than a thickness of the intermediate electrode layer on the end surfaces of the ceramic body;
   a mounting substrate including a pair of lands electrically connected to the pair of outer electrodes; and
   a pair of conductive adhesives bonding the pair of outer electrodes and the pair of lands of the mounting substrate; wherein
   the pair of outer electrodes is mounted and fixed on the mounting substrate by the pair of conductive adhesives; and
   a distance from a lowermost point of the outer electrodes on a mounting surface of the monolithic ceramic electronic component to a surface of the ceramic body is about 10.1 µm or greater and about 20.1 µm or less.

6. The mounting structure of a monolithic ceramic electronic component according to claim 5, wherein a ratio of the thickness of the intermediate electrode layer on the main surfaces and the side surfaces of the ceramic body to the thickness of the intermediate electrode layer on the end surfaces of the ceramic body is about 120% or greater and about 300% or less.

7. The mounting structure of a monolithic ceramic electronic component according to claim 5, wherein the pair of conductive adhesives include resin mixed with a metal filler.

8. The mounting structure of a monolithic ceramic electronic component according to claim 5, wherein the plurality of ceramic layers are made of one of a dielectric ceramic, a piezoelectric ceramic, a semiconductor ceramic, and a magnetic ceramic.

9. The mounting structure of a monolithic ceramic electronic component according to claim 5, wherein the monolithic ceramic electronic component is one of a piezoelectric component, a thermistor, and an inductor.

* * * * *